United States Patent [19]

Inoi

[11] Patent Number: 5,334,902
[45] Date of Patent: Aug. 2, 1994

[54] ELECTROSTRICTIVE EFFECT DEVICE

[75] Inventor: Takayuki Inoi, Tokyo, Japan

[73] Assignee: NEC Corporation, Tokyo, Japan

[21] Appl. No.: 58,941

[22] Filed: May 7, 1993

[30] Foreign Application Priority Data

May 8, 1992 [JP] Japan .................................. 4-115605

[51] Int. Cl.⁵ .......................................... H01L 41/04
[52] U.S. Cl. ..................................... 310/344; 310/328
[58] Field of Search ................ 310/328, 338, 344, 325, 310/340, 325, 340, 344

[56] References Cited

U.S. PATENT DOCUMENTS

| | | | |
|---|---|---|---|
| 4,438,363 | 3/1984 | Babitzka et al. | 310/328 |
| 4,729,459 | 3/1988 | Inagaki et al. | 310/325 |
| 4,909,440 | 3/1990 | Mitsuyasu et al. | 310/328 |
| 5,113,108 | 5/1992 | Yamashita et al. | 310/328 |
| 5,208,506 | 5/1993 | Yamashita | 310/328 |
| 5,233,258 | 8/1993 | Myoga et al. | 310/323 |
| 5,239,223 | 8/1993 | Miyoshi | 310/328 |

Primary Examiner—Thomas M. Dougherty

[57] ABSTRACT

An electrostrictive effect element is enclosed by a hermetic terminal, a thin-film metallic case, and a metallic member so as to weld the terminal onto the case and the case onto the member. The obtained unit is installed in a thick-film metallic case with sliding members such as O-shaped rings disposed between the unit and the case, thereby forming an electrostrictive effect device. Moreover, to facilitate installation of the device in an apparatus, a screw groove is disposed on a side surface at least at a location near an end surface of the thick-film case. The structure removes the disadvantage that a leakage occurs in the hermetic state due to a flaw caused on the thin-film case, for example, by a blow. Moreover, when installing the device in an apparatus, the user may grasp the device on the side surface thereof, which improves operability of the device in the installation thereof.

13 Claims, 8 Drawing Sheets

ELECTROSTRICTIVE EFFECT DEVICE

BACKGROUND OF THE INVENTION

The present invention relates to an electrostrictive effect device, and in particular, to a structure of a casing thereof.

DESCRIPTION OF THE RELATED ART

FIG. 1 shows a cross-sectional view of a conventional electrostrictive effect device or element. In the prior art, the element is configured with a plurality of layers accumulated as shown in this diagram so that a strong mechanical energy is attained with a low voltage applied thereto. Moreover, to increase strength against various environmental conditions such as humidity, the element is hermetically sealed up in a case made of metal. The metallic case is constituted of quite a thin film so as to prevent the case from hindering displacement of the element.

In the construction of FIG. 1, the electrostrictive effect device 1 of the multi-layer type is fixedly attached onto a hermetic sealing terminal 2 and a metallic member 7 by an adhesive agent. The device 1 has driving lead wires 3a and 3b soldered onto driving lead lines 4 of the terminal 2.

The thin-film case 6, the terminal 2, and the metallic member 7 are connected to each other through soldered connecting portions respectively thereof such that the electrostrictive effect element is configured in a hermetically sealed structure.

According to the device constitution of the prior art, in order to prevent the case from suppressing the displacement of the element, the metallic film forming the case, which is disposed to develop a hermetic state therein, is required to have quite a small thickness. This resultantly leads to a drawback, for example, it is necessary for the operator to carefully treat the electrostrictive effect unit; otherwise, the surface thereof may be flawed from a blow by mistake, namely, the hermetic state in the case cannot be kept remained.

In addition, since the case is made of quite a thin film, when the user installs the device, side surfaces of the case cannot be depressed. Namely, it is necessary to grasp the case on the upper and lower surfaces thereof, which leads to a difficulty that usability thereof is lowered in the actual installation.

SUMMARY OF THE INVENTION

It is therefore an object of the present invention to provide an electrostrictive device in which it is possible to prevent the case thereof from being flowed, for example, from a blow and hence to prevent the hermetic state from being deteriorated by the flawed portion and in which flexibility of installation thereof is increased.

In accordance with the present invention, there is provided an electrostrictive effect device in which a multi-layer element including electrostrictive effect ceramic layers and inner electrode conductive layers are alternately accumulated thereonto is hermetically sealed up by a case formed of a thin metallic film and a metallic member, and sliding members are disposed around the case to resultantly arrange a case of a thick film thereon.

Furthermore, a screw groove is formed in at least an end of the thick-film case to facilitate the installation thereof; moreover, on a surface of the thick-film case, there are disposed at least two flat surfaces opposing each other to facilitate the installation of the device.

BRIEF DESCRIPTION OF THE DRAWINGS

The objects and features of the present invention will become more apparent from the following detailed description taken in conjunction with the accompanying drawings in which.

DESCRIPTION OF THE PREFERRED EMBODIMENTS

Figure 1:
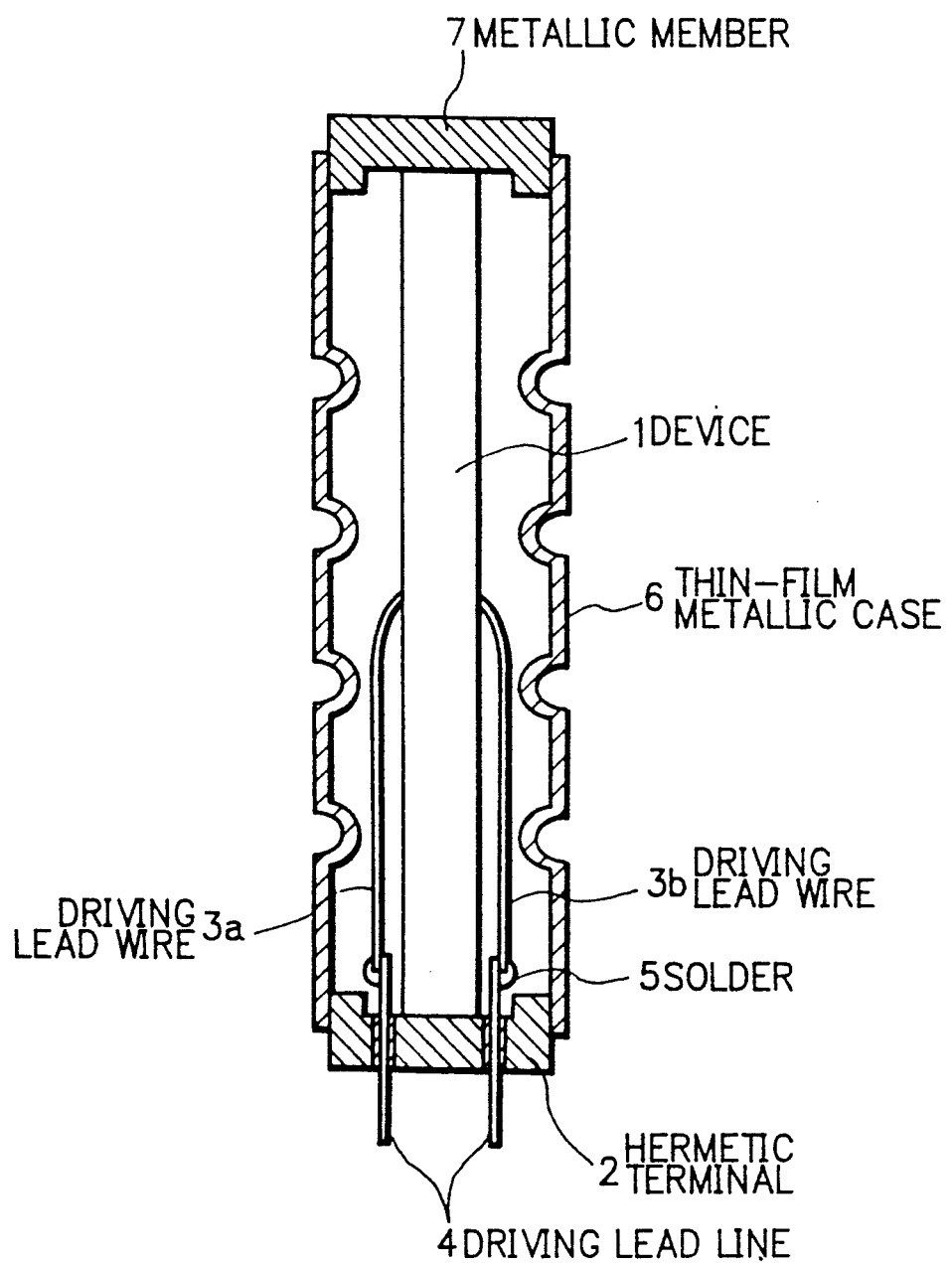
FIG. 1 is a schematic diagram showing a cross section of an example of the conventional electrostrictive effect device.

Referring now to the drawings, description will be given of embodiments in accordance with the present invention.

Figure 2:
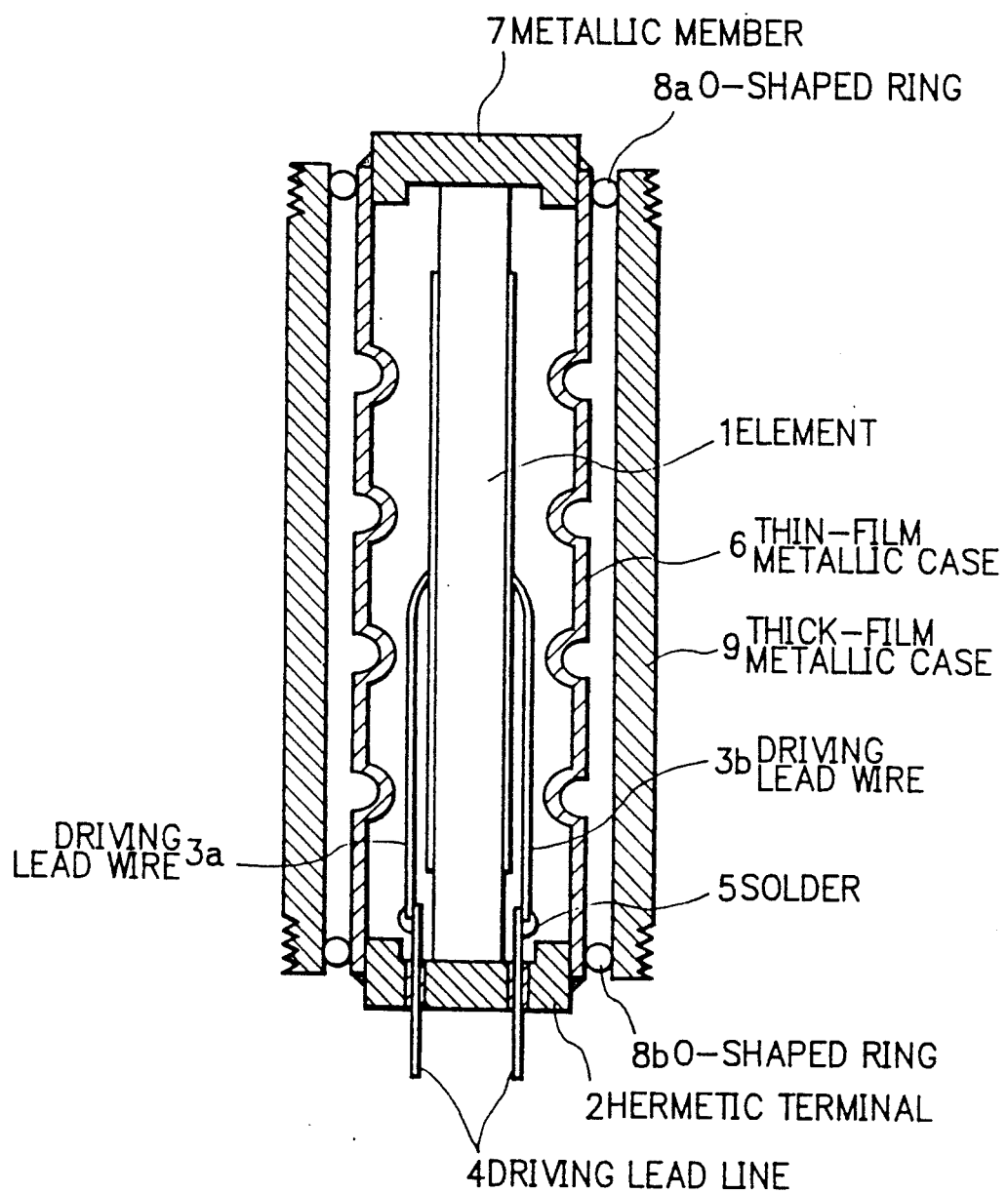
FIG. 2 is a diagram showing a cross section of an electrostrictive effect device of a first embodiment in accordance with the present invention.

FIG. 2 shows a first embodiment of an electrostrictive effect device in accordance with the present invention.

The device of the first embodiment is produced as follows. First, the lead wires 3a and 3b for driving the element 1 are connected via solder 5 onto the lead lines 4 for driving the hermetic terminal 2. Next, in assembly of the device, the element 1 is enclosed by the terminal 2, the thin-film case 6, and the metallic member 7. The assembled piece is then arranged in a vacuum heating drier to be dried therein at 150° C. for three hours. Subsequently, the air existing in the product is replaced with nitrogen gas and then a junction between the terminal 2 and the case 6 and one between the case 6 and the member 7 are soldered by a $CO_2$ gas laser in an atmosphere of nitrogen gas.

In the next step, on the side surface of the hermetically sealed unit O-shaped rings 8a and 8b made of silicon or Teflon (polytefrafluoroethylene) are respectively installed at positions respectively near the upper and lower end surfaces thereof. The obtained piece is inserted in a thick metallic film case 9 having an outer surface on which screw grooves are formed at positions respectively near the upper and lower surfaces thereof.

The resultant product can be installed for operation by the screw grooves formed on the thick-film case 9. When a voltage is applied to the element 1 via the lead wires 4, there are developed a displacement thereof.

Figure 3:
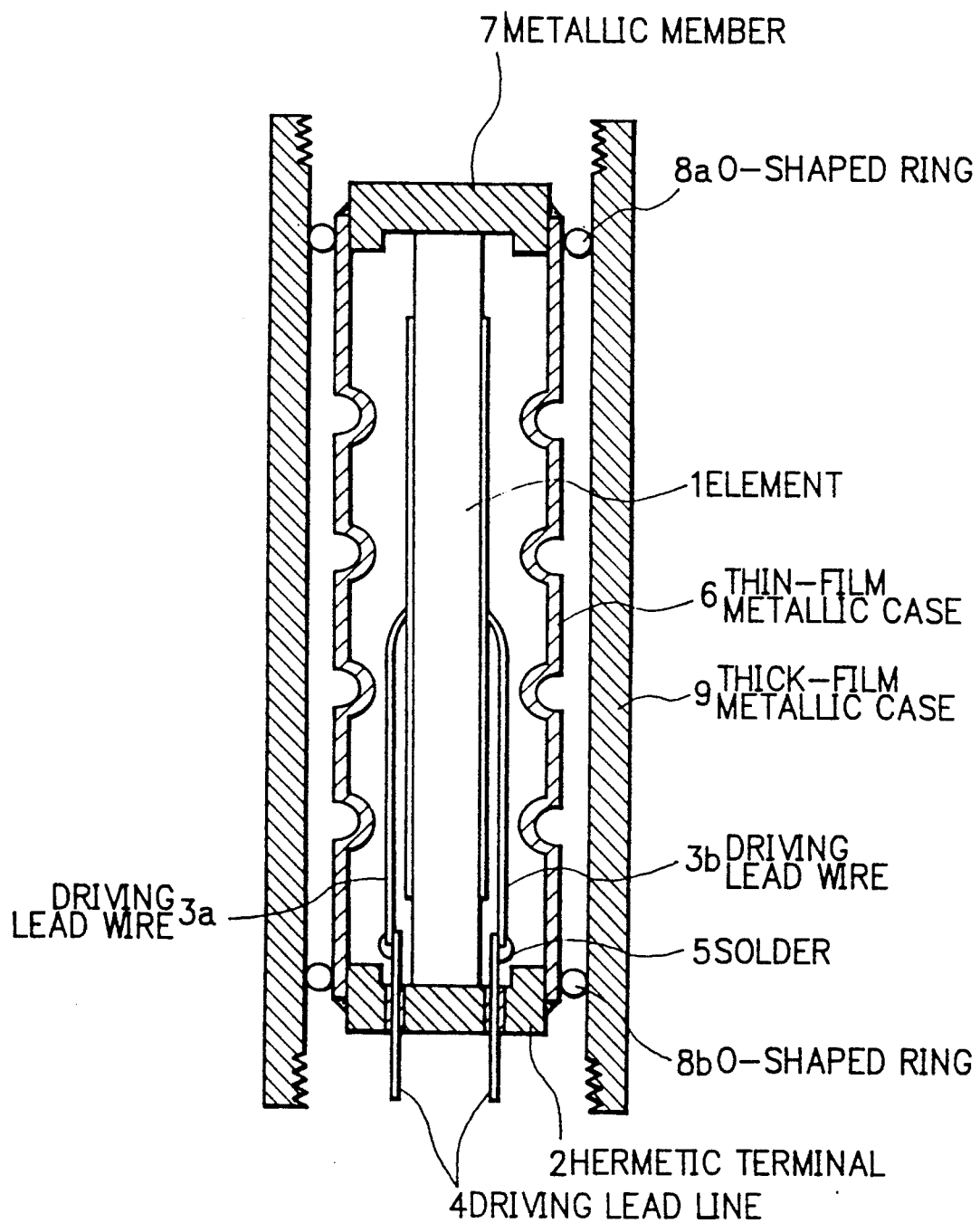
FIG. 3 is a diagram showing a cross section of an electrostrictive effect device of a second embodiment in accordance with the present invention.

FIG. 3 shows a cross section of the second embodiment. The constitution thereof is different from that of the first embodiment in that the screw grooves are fabricated on an inner surface of the case 9 at positions respectively near the upper and lower surfaces thereof.

Figure 4:
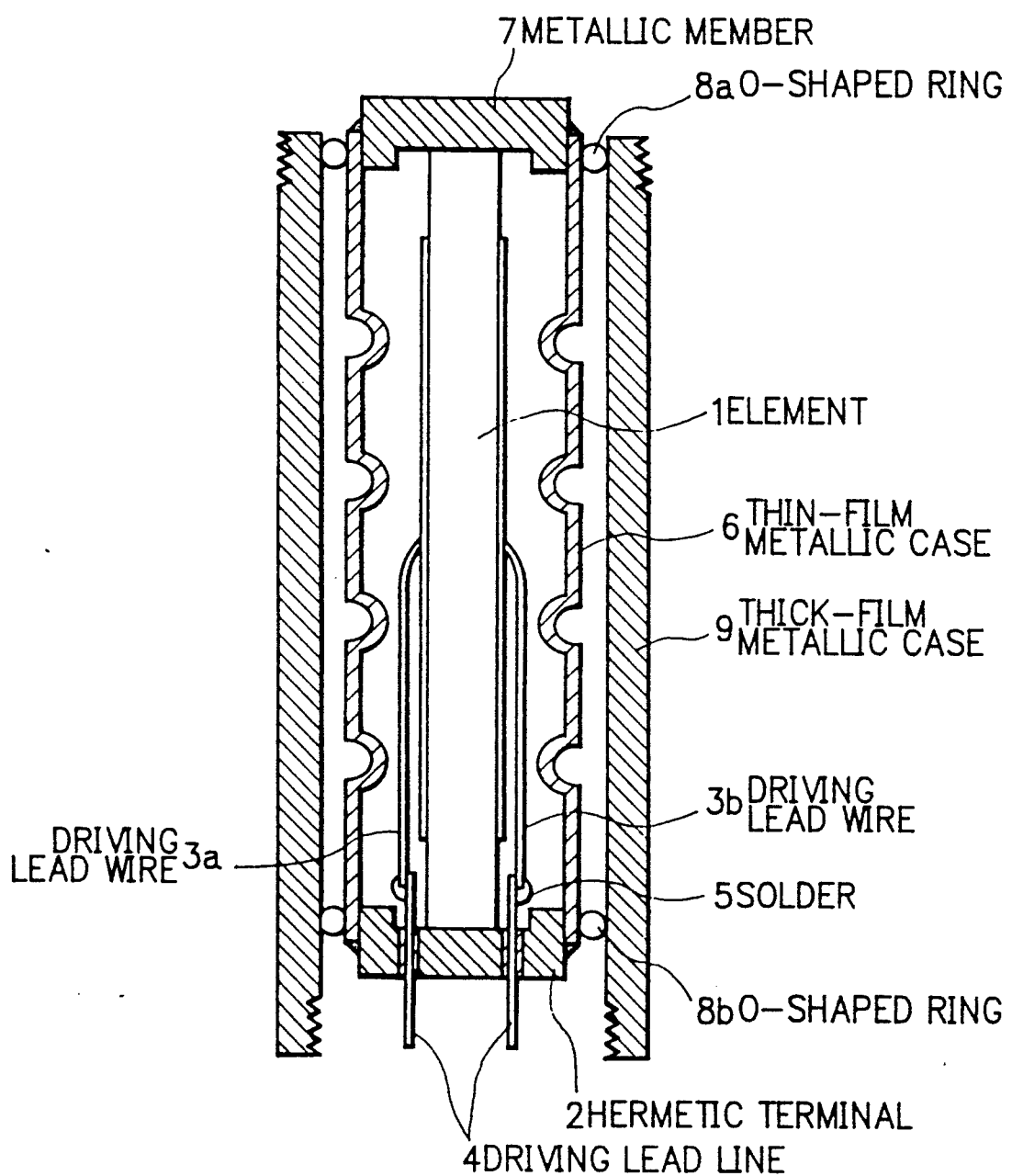
FIG. 4 is a diagram showing a cross section of an electrostrictive effect device of a third embodiment in accordance with the present invention.

FIG. 4 shows a cross section of the third embodiment. The constitution thereof is different from that of the first embodiment in that the screw grooves are manufactured such that the groove near the upper end surface is disposed on an outer circumferential surface of the case 9 and that near the lower end surface is fabricated on an inner circumferential surface of the case 9.

Figure 5:
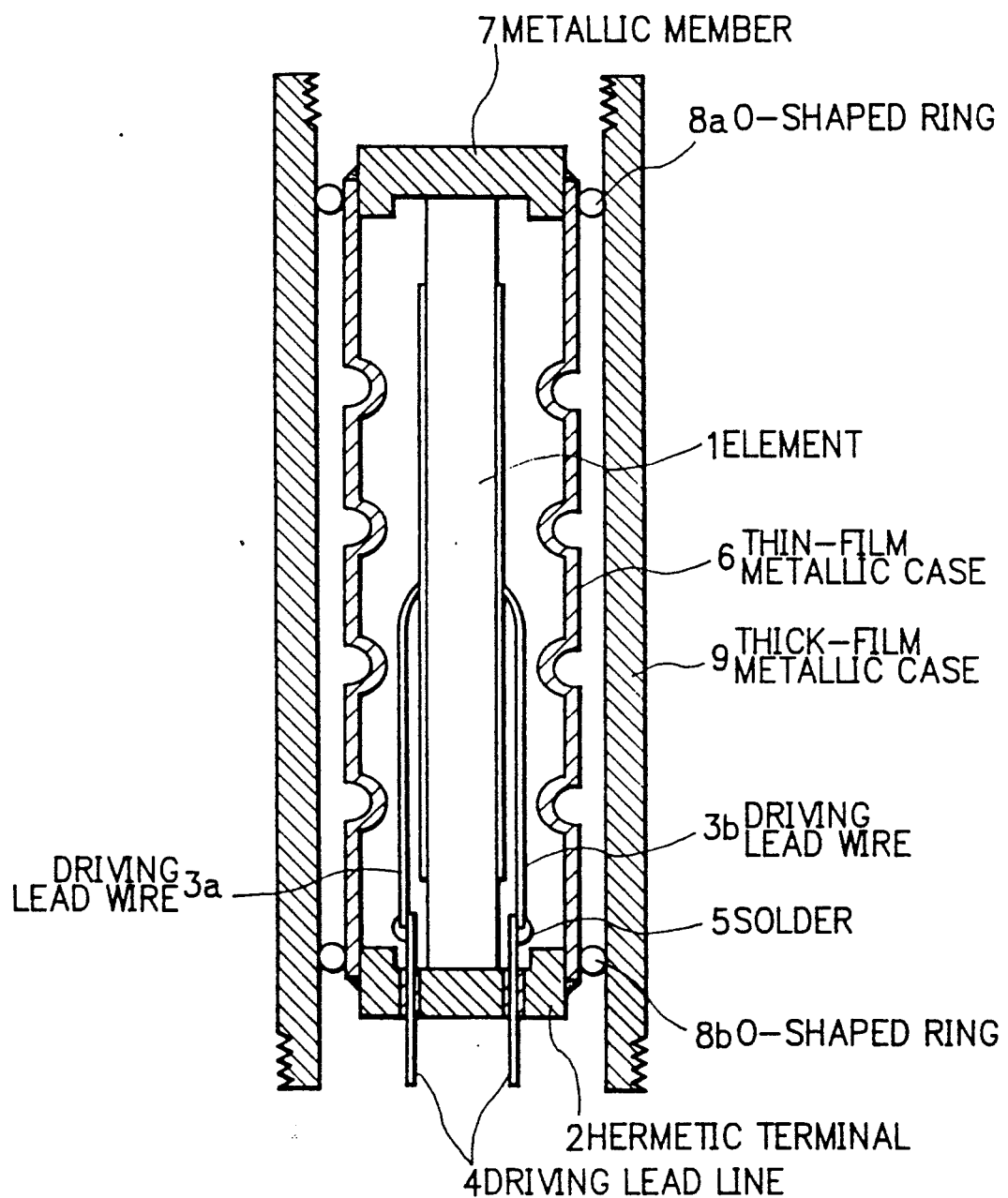
FIG. 5 is a diagram showing a cross section of an electrostrictive effect device of a fourth embodiment in accordance with the present invention.

FIG. 5 shows a cross section of the fourth embodiment. The constitution thereof is different from that of the first embodiment in that the screw grooves are manufactured such that the groove near the upper end surface is disposed on an inner circumferential surface of the case 9 and that near the lower end surface is fabricated on an outer circumferential surface of the case 9.

Figure 6:
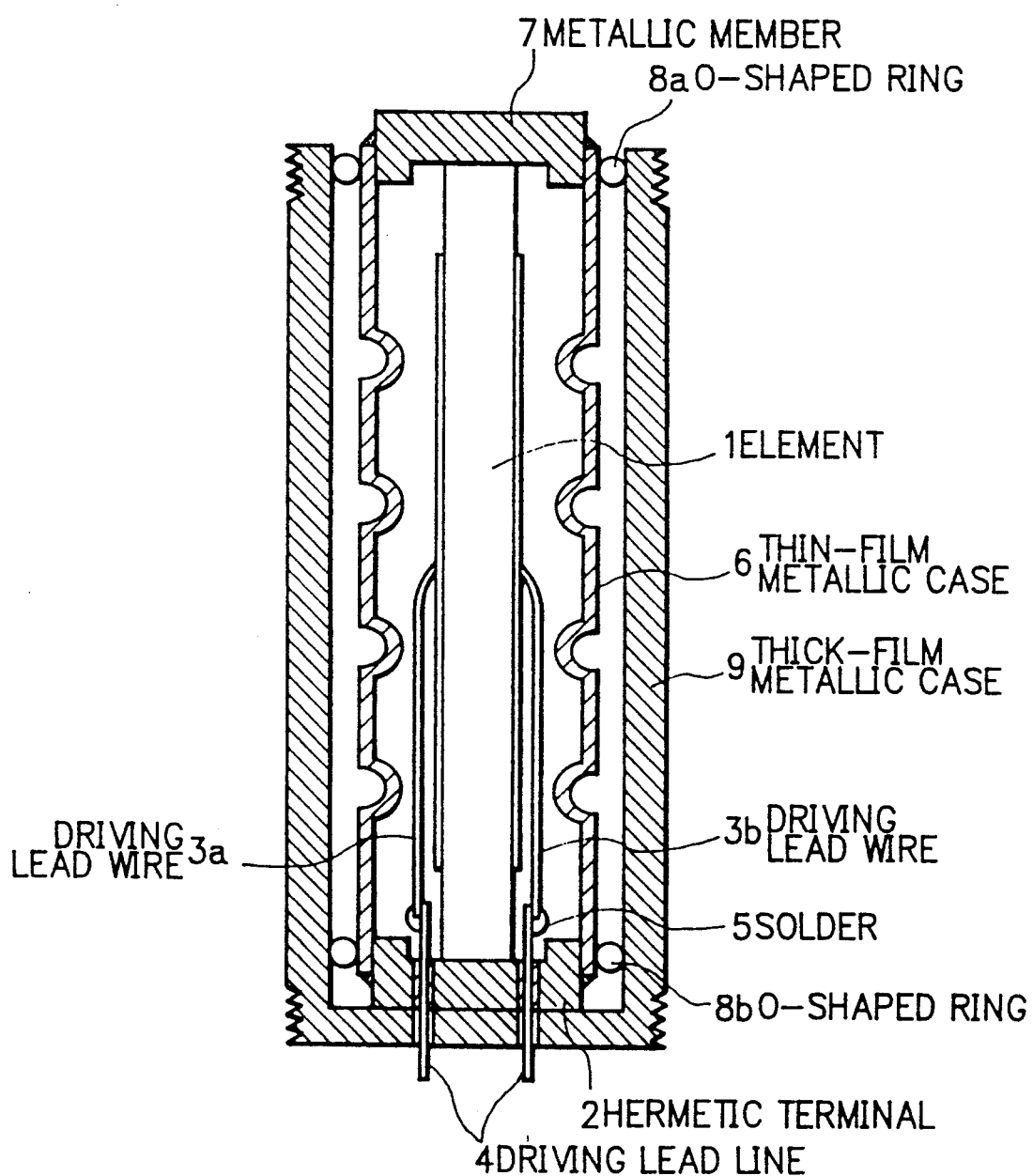
FIG. 6 is a diagram showing a cross section of an electrostrictive effect device of a fifth embodiment in accordance with the present invention.

FIG. 6 shows a cross section of the fifth embodiment. The constitution thereof is different from that of the first embodiment in that the thick-film case 9 has a bottom portion to receive an end surface of the hermetic terminal 2 and the screw grooves near the upper and end surfaces are manufactured on the outer circumferential surface thereof.

Figure 7:
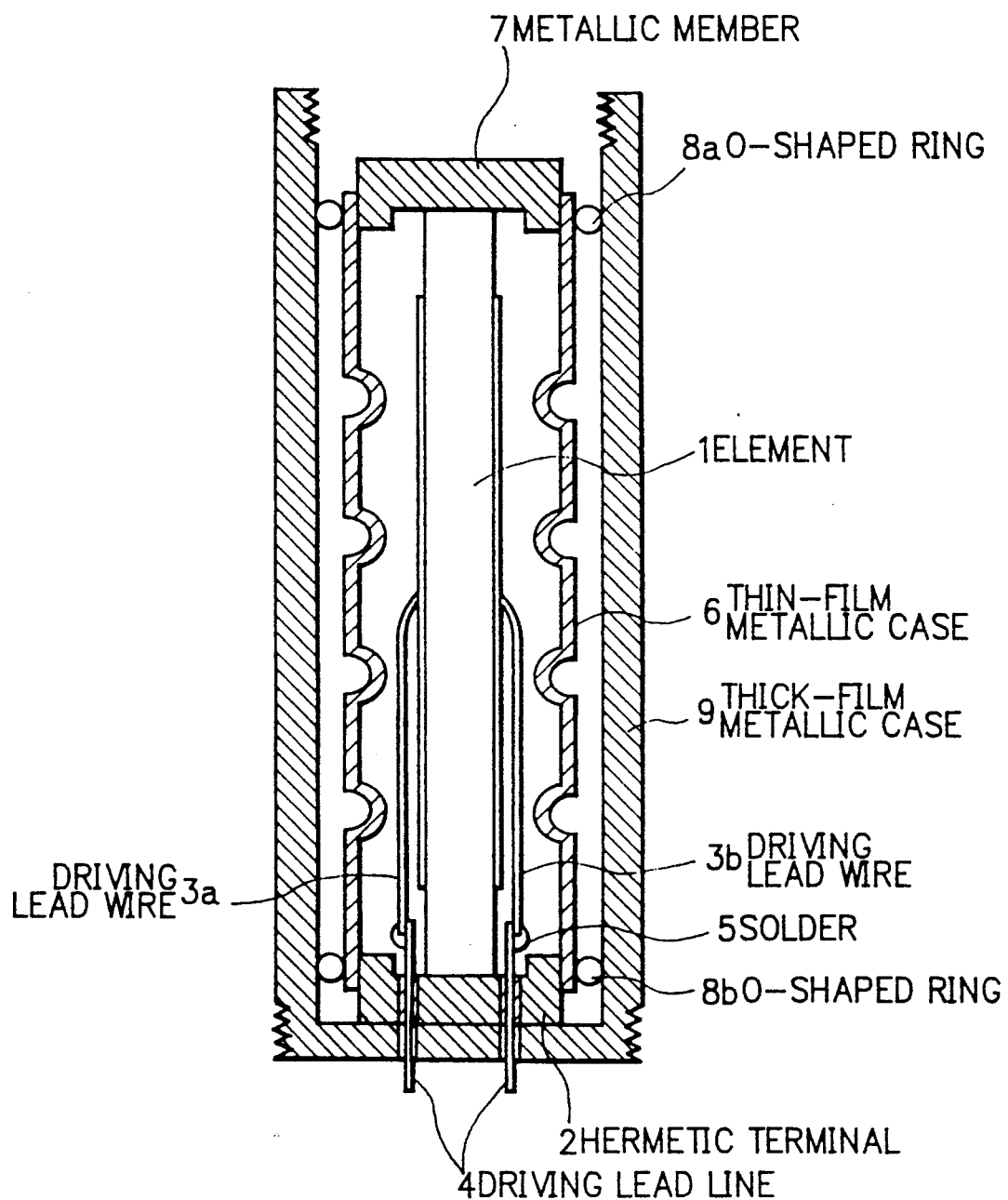
FIG. 7 is a diagram showing a cross section of an electrostrictive effect device of a sixth embodiment in accordance with the present invention.

FIG. 7 shows a cross section of the sixth embodiment. The constitution thereof is different from that of the fifth embodiment in that the thick-film case 9 has a bottom portion to receive an end surface of the hermetic terminal 2 and the screw grooves are manufactured such that the groove near the upper end surface is disposed on an inner circumferential surface of the case 9 and that near the lower end surface is fabricated on an outer circumferential surface of the case 9. In conjunction with the first to sixth embodiments, there have been described examples of screw grooves to install the device in an apparatus. Thanks to the grooves, the installation of the product is facilitated. Consequently, by selecting an appropriate structure of grooves according to an apparatus in which the product is to be installed, the installation of the electrostrictive effect unit can be efficiently achieved.

Figure 8:
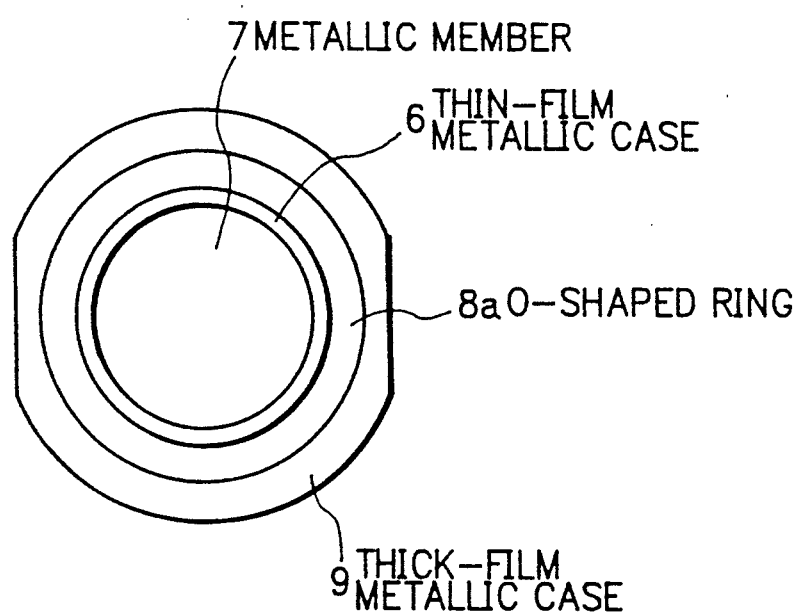
FIG. 8 is a diagram showing a cross section of an electrostrictive effect device of a seventh embodiment in accordance with the present invention.

FIG. 8 shows a cross section of the seventh embodiment. The constitution thereof is different from those of the first to sixth embodiments as follows. To grasp the side surface of the thick-film case 9 for fixation thereof, there are formed on the side surface thereof flat planar portions opposing each other.

Next, although not shown, according to an eighth embodiment in accordance with the present invention, the structure thereof is different from those of the first to seventh embodiments in that grease of silicon or Teflon polytetrafluroethylene is employed in place of the O-shaped rings. Moreover, although not shown, according to a ninth embodiment in accordance with the present invention, the structure thereof is different from those of the first to eighth embodiments in that screw grooves are formed in a direction of thickness of the thick film, not on the side surface.

In accordance with the present invention as described above, in an electrostrictive effect device in which a thin-film metallic case is adopted as a sealing cabinet thereof, a thick-film metallic case is formed on sliding members disposed on the thin-film case. This removes the disadvantage of the conventional device, namely, the thin-film case is prevented from being flawed by a blow and hence disturbance of the hermetic state due to the flaw is avoided. Moreover, in contrast to the drawback of the prior art that the device is required to be depressed only on the end surfaces in the installation thereof, the thick-film case in accordance with the present invention allows the user to grasp the case on the side surface thereof, thereby facilitating the handling of the device in the installation thereof.

While the present invention has been described with reference to the particular illustrative embodiments, it is not to be restricted by those embodiments but only by the appended claimd. It is to be appreciated that those skilled in the art can change or modify the embodiments without departing from the scope and spirit of the present invention.

What is claimed is:

1. An electrostrictive effect device, comprising:
   a multi-layer element in which electrostrictive effect ceramic layers and inner electrode conductive layers are alternately accumulated thereonto;
   a thin-film case formed of a thin metallic film and a metallic member, the film and the member hermetically sealing up the multi-layer element;
   sliding members disposed around the thin-film case; and
   a thick-film case disposed around the sliding members.

2. A device in accordance with claim 1, wherein each of the sliding members is an O-shaped ring formed of vinyl chloride, silicon, or Teflon polytetrafluroethylene.

3. A device in accordance with claim 1, wherein each of the sliding members is a grease made of silicon, or Teflon polytetrafluroethylene.

4. A device in accordance with claim 1, wherein the thick-film case has a screw groove on a side surface thereof at least at an end thereof.

5. A device in accordance with claim 1, wherein the thick-film case possesses at least two flat planar portions on a side surface thereof, the planar portions opposing each other.

6. A device in accordance with claim 1, wherein the thick-film case includes at least one screw groove on a side surface thereof formed in a direction of thickness thereof.

7. A device in accordance with claim 4, wherein the screw groove is disposed on an inner circumferential surface of the thick-film case at an upper end and a lower end thereof.

8. A device in accordance with claim 4, wherein the screw groove is disposed on an outer circumferential surface of the thick-film case at an upper end and a lower end thereof.

9. A device in accordance with claim 4, wherein a screw groove is disposed on an outer circumferential surface of the thick-film case at an upper end thereof and a screw groove is disposed on an inner circumferential surface thereof at a lower end thereof.

10. A device in accordance with claim 4, wherein a screw groove is disposed on an inner circumferential surface of the thick-film case at an upper end thereof and a screw groove is disposed on an outer circumferential surface thereof at a lower end thereof.

11. A device in accordance with claim 1, wherein the thick-film case has a bottom portion at a lower end thereof.

12. A device in accordance with claim 10, wherein the thick-film case has a bottom portion at a lower end thereof.

13. A device in accordance with claim 1, wherein the thick-film case is made of a metal.

* * * * *